United States Patent [19]

McCracken et al.

[11] Patent Number: 4,507,576
[45] Date of Patent: Mar. 26, 1985

[54] METHOD AND APPARATUS FOR SYNTHESIZING A DRIVE SIGNAL FOR ACTIVE IC TESTING INCLUDING SLEW RATE ADJUSTMENT

[75] Inventors: David R. McCracken, Portland; Robin R. Larson, Aloha, both of Oreg.

[73] Assignee: Tektronix, Inc., Beaverton, Oreg.

[21] Appl. No.: 437,248

[22] Filed: Oct. 28, 1982

[51] Int. Cl.$^3$ ...................... H03K 5/12; H03K 19/092
[52] U.S. Cl. .................................... 307/475; 307/263; 307/268; 307/443; 307/465; 324/73 R; 371/27
[58] Field of Search ................ 307/443, 446, 454–456, 307/465–467, 473, 475, 494, 263, 264, 268; 324/73 R–73 PC; 371/27

[56] References Cited

U.S. PATENT DOCUMENTS

| | | | |
|---|---|---|---|
| 3,832,535 | 8/1974 | De Vito | 324/73 AT X |
| 3,914,623 | 10/1975 | Clancy | 307/263 X |
| 3,982,115 | 9/1976 | Traa | 307/494 X |
| 4,241,362 | 12/1980 | Van der Valk | 307/494 X |
| 4,339,669 | 7/1982 | Jarrett et al. | 307/475 X |
| 4,399,405 | 8/1983 | Welzhofer | 324/73 AT |
| 4,439,858 | 3/1984 | Petersen | 371/27 X |

OTHER PUBLICATIONS

Prilik, "Dedicated Pin, Multiple Function Testing Circuit For LSI", IBM Tech. Disc. Bull., vol. 19, No. 3, Aug. 1976, pp. 987–988.
Millham et al., "Logical Assembly Testing System", IBM Tech. Disc. Bull., vol. 14, No. 11, Apr. 1972, pp. 3446–3449.

Primary Examiner—Stanley D. Miller
Assistant Examiner—David R. Hudspeth
Attorney, Agent, or Firm—John H. Bouchard; Robert S. Hulse

[57] ABSTRACT

A special purpose pulse amplifier with programmable high and low levels for complex IC testing is disclosed. Its output has independently programmable positive and negative transition rates and is reverse terminated in 50 ohms. It also has the ability to be switched to a high resistance, low capacitance output state. This circuit is the interface between a complex, computer controlled system of timing and pattern generation hardware, and an integrated circuit to be tested. This device has reduced waveform aberrations, lower inhibited capacitance, low input to output delay for reducing timing error, programmable signal transition rates, and the amplitude range and transition rate control to accommodate all the important device technologies expected in high pin-count parts.

14 Claims, 5 Drawing Figures 4,507,576

METHOD AND APPARATUS FOR SYNTHESIZING A DRIVE SIGNAL FOR ACTIVE IC TESTING INCLUDING SLEW RATE ADJUSTMENT

BACKGROUND OF THE INVENTION

This invention relates to IC testing, and more particularly to IC drivers having the capability of generating waveforms compatible with the logic family of the IC under test.

There are many complex IC devices on the market of numerous logic families, and some of the devices included mixed logic families. In order to test a complex IC having 128 pins, perhaps more, all of its pins must be properly addressed during the test. This requires prior knowledge of the waveform characteristics that the particular pin requires as an input and what the expected output, if any, should be. Many complex IC's make double duty of the pins because of their complexity and the mechanical limits on the number of external pins each device can have. Thus, the IC test instrument must have prior knowledge as to whether each pin of the IC under test is for input only, for output only, or bidirectional. In addition, each IC pin may be a two or three-state pin.

The prior art IC testers have generally been limited as to only having the capability of testing IC's of a single logic family (e.g. TTL or ECL). The Tektronix Model 3280 is such a tester for ECL IC devices. Additionally, most of the devices presently available for testing IC's are computer controlled.

What is needed is an IC driver having a low transmission delay from input to output that can generate signals having state transition times which are fast enough to match those of the fastest IC logic family (e.g. ECL) yet are programmable to slow down the state transition time to match slower IC logic families, that is state amplitude programmable to match the necessary voltage levels required by each IC logic family, and having a low inhibited output capacitance for more realistic testing of tri-state devices. It is believed that the present invention is such a device.

SUMMARY OF THE INVENTION

In accordance with the illustrated embodiment, the present invention provides a method and apparatus to convert one digital signal that is compatible with one logic family to another digital signal that is compatible with another logic family. The method and apparatus perform this function on the one digital signal given the high and low logic levels and the positive and negative slew rates for another digital signal which are predetermined by other means.

This method and apparatus also includes means for inhibiting the conversion during another predetermined period. During the inhibit period the output line is floating. Stated another way, the other digital signal is a tri-state signal.

DESCRIPTION OF THE PREFERRED EMBODIMENT

Each of the various logic circuit families generate and accept signals with characteristic logic signal levels and logic state transition rise- and fall-times. Thus, a universal logic tester must have the capability to adjust these signal components to properly interface with the selected IC to be tested. Since each pin of the IC to be tested can require a signal having a selected binary string and may require a signal having characteristics for a different logic family, there must be included in the test set an individually programmable pin card for each pin of the IC to be tested. Each of these cards must also be able to receive, as well as transmit since many IC pins are output pins as well as input pins.

Additionally, the signal delay from input to output of each pin card must be minimized to maintain some measure of signal edge position accuracy. This is particularly important for repeatability of results since each pin of the IC under test is being activated at substantially the same time and in computer IC's there is some interaction between the signals applied to various pins.

To be able to provide the speed necessary over the ranges of logic families to be testable with the circuit of the preferred embodiment, the speed of that circuit must be at least as fast as the fastest (i.e. shortest rise- and fall-times) logic family to be testable. Based on current technology ECL is the fastest logic family, thus the majority of the components on each pin card will be of that family.

Figure 1:
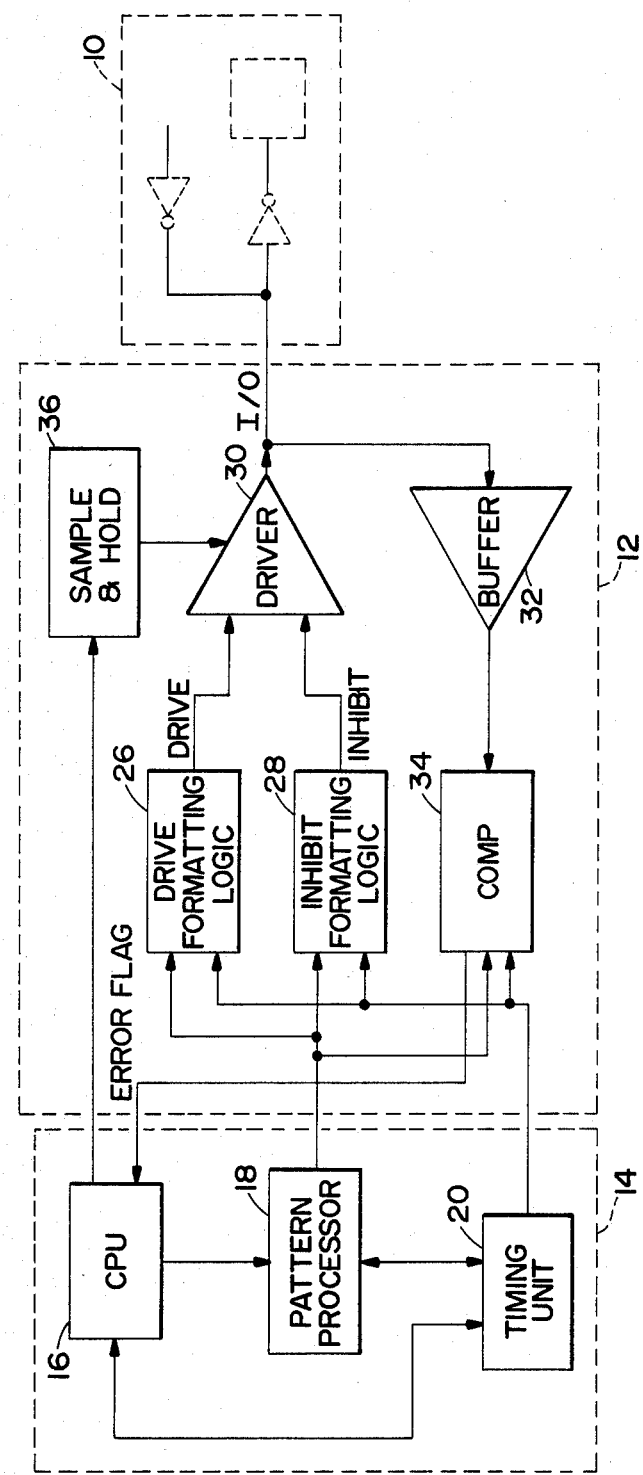
FIG. 1 is a simplified block diagram of a computer controlled automatic IC tester incorporating the IC driver of the present invention.

Referring now to FIG. 1 there is shown a test system computer 14 communicating to one pin card 12 which in turn is communicating with a single pin of an IC device under test (DUT) 10. In the complete test system, the test system computer 14 would be addressing as many pin cards 12 as there are pins on the DUT 10.

Test system computer 14 includes a CPU 16, a pattern processor 18, and timing unit 20. Pin card 12 includes drive formatting logic 26, inhibit formatting logic 28, driver 30, buffer 32, comparator 34 and sample and hold 36.

In operation, test system computer 14 defines the logic pattern and timing of the pulses to be applied to each of the pins of DUT 10, and each of pin cards 12 generates the appropriate pulses with the appropriate characteristics to be applied to the pin of DUT 10 with which it communicates. In computer 14 this is done under the control of CPU 16. Pattern processor 18 (e.g. Tektronix Model 2952) can generate the test signals algorithmically or from prestored patterns therein for the necessary logic family formats and pin signal requirements for numerous IC's prestored. Timing unit 20 (e.g. Tektronix 2945) generates the necessary timing signals for each of the pins of DUT 10 in combination with ROM 24 which has the pin timing information prestored for numerous IC's.

The pin pattern and timing information for the selected DUT is then applied to the pin card 12 that is addressing that pin of DUT 10. The drive formatting logic 26 and the inhibit formatting logic 28 receive those signals. The output of each of these are applied to driver 30. It is the function of the drive formatting logic 26 to synthesize the pulses having the appropriate timing and pattern information for application to the DUT 10 pin via driver 30. Similarly, the inhibit formatting logic 28 synthesizes the signals and their timing for application to driver 30 to cause the output impedance of driver 30 to go infinite (i.e. there is no signal from driver 30 aplied to DUT 10) at the proper time. This is necessary when DUT 10 is outputting a signal to pin card 12 from the pin under test. It should be noted here that driver 30 is either in the drive mode or the inhibit mode; it cannot be in both, simultaneously. Further, driver 30 need not be placed in the inhibit mode if the pin of DUT 10 being addressed is not both an input and output pin.

When DUT 10 is outputting a signal to pin card 12 (driver 30 inhibited) that signal is applied to comparator 34 via buffer 32. This signal is then compared to the expected output of DUT 10 by comparator 34. Pattern processor 18 and timing control 20 provide the information as to the expected output signal to comparator 34. If an error is detected, the error flag for this pin is set and transmitted to test system computer 14. If no output signal is expected on this DUT 10 pin, test system computer 14 is instructed to ignore an error flag from that pin card 12.

Figure 2:
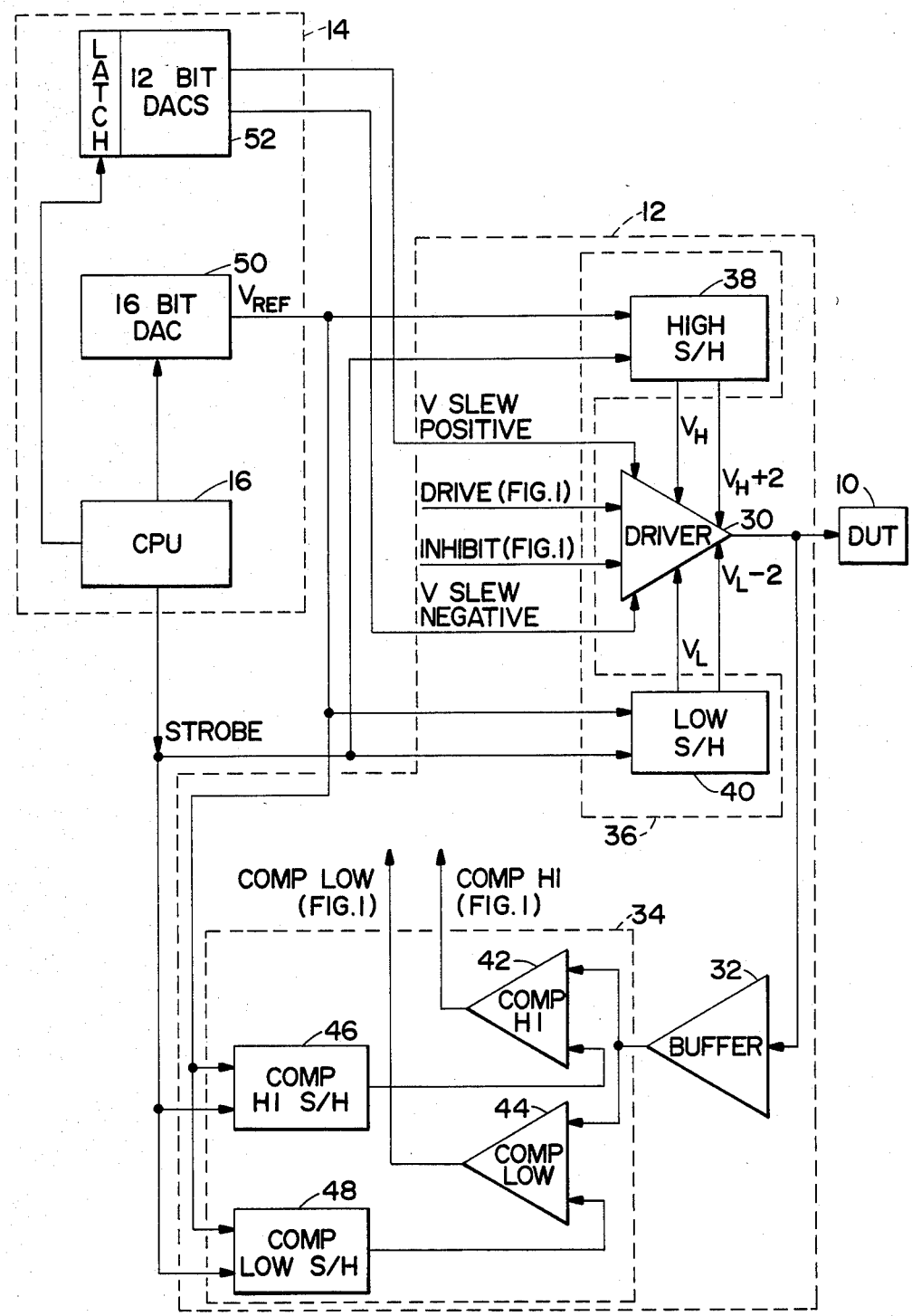
FIG. 2 is an enhanced block diagram of the automatic IC tester of FIG. 1.

Referring now to FIG. 2, the computer 14 and pin card 12 are shown in greater detail. Computer 14 is shown with 12 bit DACs 52 with associated latch and 16 bit DACs 50 both also under the control of CPU 16. Pin card 12 is shown in greater detail in the areas of sample and hold 36 and comparator 34. Sample and hold 36 includes a high sample and hold 38 and a low sample and hold 40. Comparator 34 includes a high comparator 42, a low comparator 44, a comparator high sample and hold 46, and a comparator low sample and hold 48.

Sample and holds (S/H) 38 and 40, in response to 16 bit DAC 50 provide the high and low logic state voltage values, respectfully, to driver 30 to match the amplitude levels of the logic family of DUT 10. The pair of 12 bit DACs 52 provide the positive and negative slew rate information to driver 30, to match the rise- and fall-times of the signals of the logic family of DUT 30, or more particularly, the logic family characteristics of the particular pin of DUT 10 being addressed by the selected pin card 12. These values are transferred in response to the strobe from CPU 16. The amplitude, or logic state voltages, of the expected output signal from DUT 10 is set similarly using comparator high and low S/Hs 46 and 48.

Figure 3:
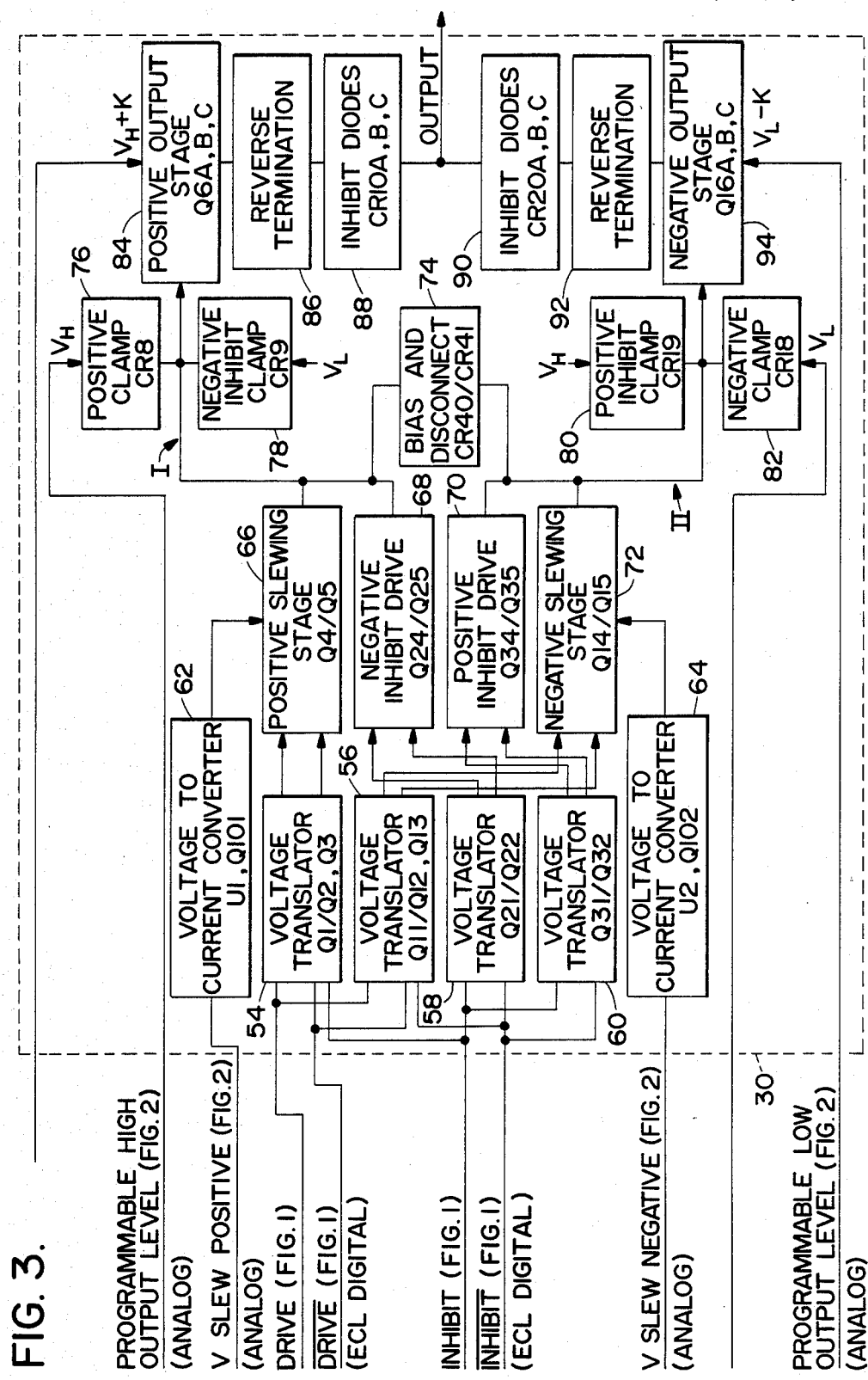
FIG. 3 is a simplified block diagram of the preferred embodiment of the IC driver of the present invention.
Figure 4A:
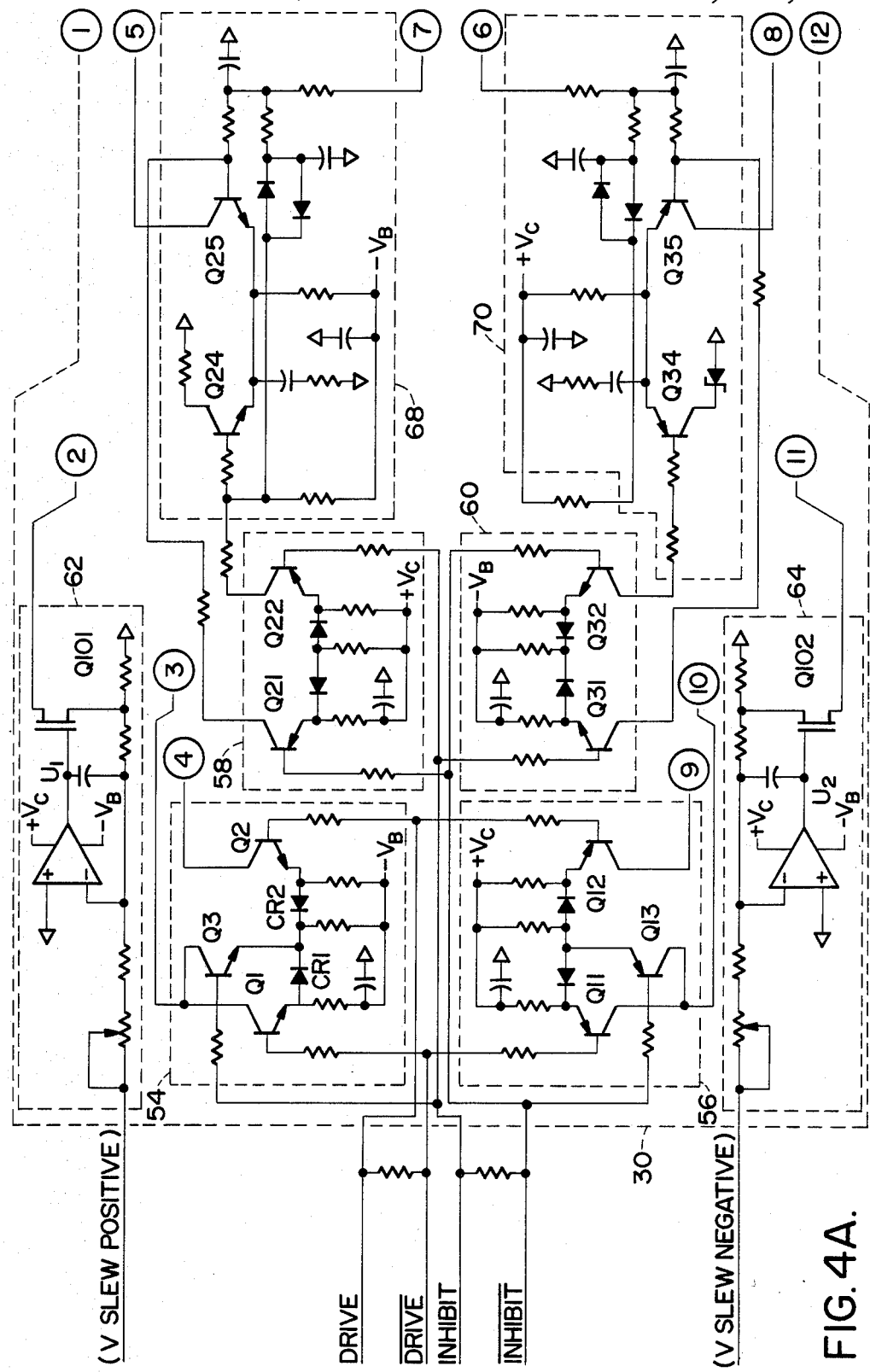
FIGS. 4A and 4B are a schematic representation of the block diagram of the preferred embodiment of FIG. 3.
Figure 4B:
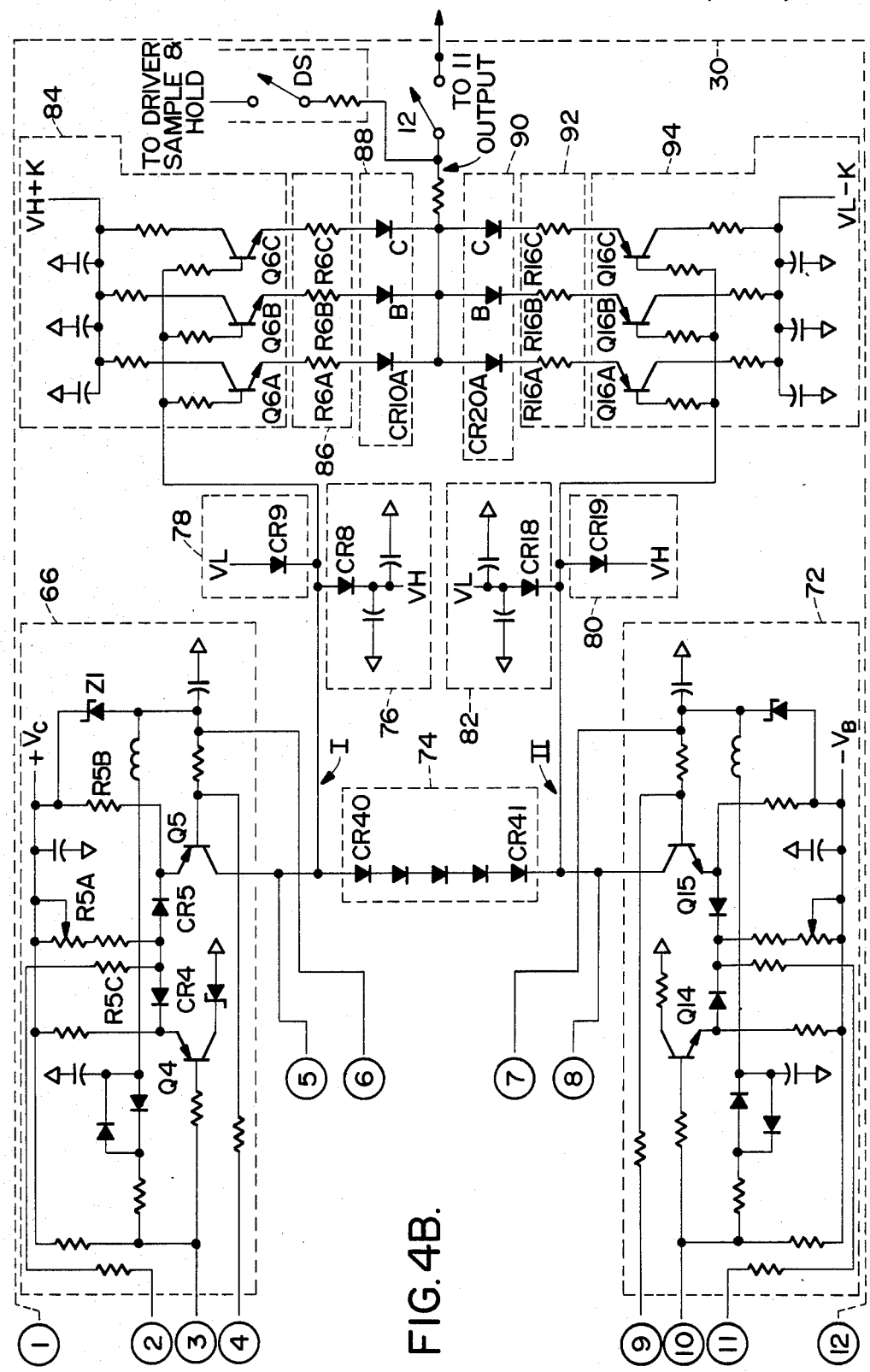

The main subject of this disclosure is the programmable driver 30 which is shown in detail in FIGS. 3 and 4. Referring now to FIG. 3 there is shown a detailed block diagram of driver 30 including voltage to current converters 62 and 64, voltage translators 54, 56, 58 and 60, slewing stages 66 and 72, inhibit drives 68 and 70, bias and disconnect circuit 74, clamps 76, 78, 80 and 82, output stages 84 and 94, reverse terminations 86 and 92, and inhibit diodes 88 and 90.

Driver 30 requires a differential digital input for each of the DRIVE and INHIBIT signals at standard ECL logic levels. Also required are analog signals representative of the positive and negative slew rates of the logic family of DUT 10, and a pair of analog voltages to establish the logic state voltage levels of the logic family of DUT 10. The differential DRIVE signals are each applied to voltage translators 54 and 56 which provide a differential, switched current to the positive and negative slewing stages 66 and 72, respectively.

Assume that DRIVE has been in its low state and that INHIBIT is low, therefore the OUTPUT is low having a voltage level substantially equal to $V_L$, the programed low logic state output level via negative clamp 82 and negative output stage 94. In this condition, the output of positive slewing stage 66 is in its low current state and the output of the negative slewing stage 72 is in its high current state. Most of the output current of stage 66 flows through the bias and disconnect circuit 74 from node I to node II. The balance of that current drives the bases of the transistors of the positive output stage 84. The negative slewing stage 72 sinks the current from stage 66 and the base current of the transistors of the negative output stage 94 with the balance of the stage 72 high current being supplied by $V_L$ via negative clamp 82, thus establishing the low state voltage of the output signal.

Next assume that DRIVE changes to the high state. The output of the negative slewing stage 72 will switch to its low current state and output of the positive slewing stage 66 will switch to its high current state. The voltages at nodes I and II will begin moving positively in unison at a rate determined by the amount of excess current from the positive slewing stage 66 and the total device and substate parasitic capacitance at nodes I and II. This will continue until the voltage at node I exceeds $V_H$, at which time positive clamp 76 will clamp node I and stop the voltage excursion of nodes I and II, thus establishing the high state voltage of the output signal.

The excess current from the slewing stage 66 or 72 and the parasitic capacitance determines the transition, or slewing, rate of the node voltages. This current can be reduced by means internal to the slewing stage 66 or 72 in cooperation with voltage to current converter 62 or 64, respectively, thus allowing the programing of the positive and negative transition rates.

Assume now that INHIBIT changes to the high logic state. Drive voltage translators 54 and 56, in response to the high INHIBIT state will cause both the positive and negative slewing stages 66 and 72 to assume the low output current state. Simultaneously, inhibit voltage translators 58 and 60 will cause the output current of both the negative and positive inhibit drives 68 and 78 to switch to the high current state. Negative inhibit clamp 78 clamps node I voltage at $V_L$. Similarly, positive inhibit drive 70 drives node II positive until the positive inhibit clamp 80 clamps node II voltage at $V_H$. In this condition, inhibit diodes 88 and 90 are reverse biased, disconnecting, or inhibiting the output of driver 30.

FIG. 4 shows a schematic implementation of driver 30 as shown in FIG. 3 with the circuit divided into blocks having the same numbers as the blocks of FIG. 3. The circuit includes two operational paths—the drive path and the inhibit path, with the former being the primary path.

DRIVE FUNCTION

The differential digital DRIVE signals are applied to voltage translators 54 and 56. Each of voltage translators 54 and 56 consists of a differential amplifier with the drive signal being applied to the base of Q2 and Q12 in each of the translators and the $\overline{\text{DRIVE}}$ signal being applied to the base of the opposite transistors, Q1 and Q11. The function of the voltage translators is to translate the drive input logic levels which are at ECL levels (−0.8 V to −1.6 V) to the desired logic levels of the IC family of the DUT 10 via the positive and negative slewing staes 66 and 72. The differential drive signals each drive voltage translators 54 and 56 differentially. In voltage translator 54, diodes CR1 and CR2 are connected in opposition between the emitters of Q1 and Q2. The function of these diodes is to cause the collector current of Q1 to switch from approximately 1 ma to approximately 7 ma. When the drive signal goes positive, for example, Q2 switches from a 1 ma state to a 7 ma state. When Q2 switches it pulls down the base of Q5 in positive slewing stage 66. Positive slewing stage 66, also includes a differential pair consisting of transistors Q4 and Q5. With the base of Q5 pulled down, Q4 and Q5 are now at a higher voltage compatible with the ultimate output swing of the circuit. So when Q5 is pulled down slightly, Q4 is released causing a large current switch between Q4 and Q5. This current switch means that Q5 is running at its maximum slew rate with approximately 25 ma of collector current. The collector current in Q5 can vary from 5 ma at idle to 30 ma in its high state. When Q5 is in its high state, node I moves positively at approximately 1 volt per nanosecond until its voltage exceeds $V_H$ by the drop through CR8, the positive inhibit clamp 76, a Schottky diode. At the same time node II is pulled positively through the bias and disconnect 74 which consists of a series string of 5 diodes designated as CR40 through CR41.

The second voltage translator 56 being driven by differential digital DRIVE signals also includes a differential pair including transistors Q11 and Q12. This differential pair operates in exact opposition to the differential pair of voltage translator 54. For example, when DRIVE goes positive, Q12 switches to a collector current state of 1 ma and Q11 switches to a 7 ma collector current state. When this happens, Q15 of the negative slewing stage 72 is switched to its 5 ma collector current state. Negative slewing stage 72 also includes a differential pair Q14 - Q15. Thus when Q15 switches to its low current state, Q14 switches to its high collector-current state. Thus, the net result of voltage translators 54 and 56 switching is to cause Q5 to switch to its high collector current state (30 ma) and Q15 to switch to its low collector current state (5 ma). Thus the collectors of Q5 and Q15 allow the voltage on nodes I and II, respectively, to move from being clamped by negative clamp 82 to $V_L$, to being clamped by the positive clamp 76 to $V_H$. A switching of the positive and negative slewing stages 66 and 72 cause the voltages at nodes I and II to track each other by virtue of the fact that there is always a current of approximately 5 ma flowing through the bias and disconnect circuit 74. Since bias and disconnect 74 includes a series string of diodes, a voltage of approximately 3.1 v is maintained between nodes I and II.

When Q5 is switched to its high collector current state, the voltage at node I is determined by $V_H$, plus the drop across diode CR8, the positive clamp 76. Diode CR18 of negative clamp 82 is backbiased under these conditions. If the DRIVE and $\overline{\text{DRIVE}}$ switch states, Q5 and Q15 will also switch states resulting in node II being pulled down to approximately $V_L$ through conducting diode CR 18 with node I being maintained at 3.1 v above $V_L$.

The 3.1 v difference between the voltages at node I and node II is necessary to maintain output stages 84 and 94 in the active region throughout the operational cycle of driver 30. Thus, a voltage drop is maintained across resistors R6 a, b, and c and R16 a, b, and c in reverse terminations 86 and 92, respectively. Thus approximately 10 ma collector current is maintained through transistors Q6 a, b and c, and Q16 a, b and c of positive output stage 84 and negative output stage 94, respectively.

The high and low logic state voltage levels of the signal to be outputted from driver 30 have been established by the sample and holds 38 and 40, shown in FIG. 2, as discussed earlier. Thus driver 30 causes the levels of the output signal to be set to those earlier selected levels.

Driver 30 also has the capability of setting the rise and fall times, or the positive and negative slew rates of the output signal to preselected values. This is done by positive and negative slewing stages 66 and 72. The positive slew rate is varied by controlling the current flowing from the node between opposing diodes CR4 and CR5 connected between the emitters of Q4 and Q5 of the positive slewing stage 66. The current that establishes the maximum positive slewing rate is established by resistors R5A and R5B at some value as determined by the drop across Zener diode Z1, the base emitter drop across transistor Q5, and the drop across diode CR5. If Zener diode Z1 is a 5.6 v Zener, the voltage at the node between diode CR4 and CR5 is typically about 4.5 v and, therefore, the current that is necessary to cause a voltage change across the parasitic capacitance of the circuit at nodes I and II. There is actually parasitic capacitance due to the circuit layout, transistors, diodes, etc., all which adds up to approximately 25 pf and when coupled with a 25 ma unbalanced current produces a one volt per nanosecond slewing rate.

By programming the reduction in the current flowing from the node between diodes CR4 and CR5, the slewing rate can be adjusted. A lower available current to charge the parasitic capacitance to the same voltage will result in a slower slew rate (i.e., a slower rise time). The current from diodes CR4 and CR5 can be varied by voltage to current converter 62 which includes amplifier U1 and FET Q101. Amplifier U1 operates under the control of an analog signal supplied by the 12 bit DAC 52 of test system computer 14 as shown in FIG. 2. The voltage applied to U1 typically ranges from 0 volts to −10 volts to produce a current through FET Q101 of 0 to 25 ma. Restated, the more current that flows through FET Q101 the greater amount of current that is removed from the node between diodes CR4 and CR5, resulting in less current being available to be switched into nodes I and II by Q5, thus controlling the positive slew rate.

The negative slew rate is similarly adjustable by means of negative slewing stage 72 and voltage to current converter 64. It should be noted however, that the positive and negative slew rates are adjustable independent of each other making it possible to have a very slow positive slew rate in a very fast negative slew rate or whatever combination is necessary to match the characteristics of DUT 10.

INHIBIT FUNCTION

The second differential digital input signal pair applied to driver 30 is the INHIBIT signal. These signals are applied to voltage translators 58 and 60 as well as the drive signal voltage translators 54 and 56. The inhibit signal is also an ECL level signal. Voltage translators 58 and 60 each include a differential pair Q21 and 22, and Q31 and 32, respectively. The output of voltage translator 58 is applied to negative inhibit driver 68 and the output of voltage translator 60 is applied to positive inhibit driver 70. Inhibit drivers 68 and 70 each also include a differential transistor pair Q24 and Q25, and Q34 and Q35, respectively. When the inhibit signal goes high, Q25 of negative inhibit driver 68, in response to the output of voltage translator 58, is switched to a high collector current state. In response the voltage at node I is pulled negative until the negative inhibit clamp 78 including diode CR9 is turned on. This results in node I being driven down in voltage to $V_L$. Similarly, voltage translator 60 causes transistor Q35 of the positive inhibit drive 70 to switch to its high collector current state resulting in node II being pulled up to $V_H$ as the positive inhibit clamp 80 including diode CR19 becomes forward biased. This results in a bias and disconnect circuit 74 being activated causing the voltage at nodes I and II to reverse. It should be noted at this point that, in this condition, with node II higher in voltage than node I, there is no longer a 3.1 v spread between the nodes. This reverse in node voltage causes transistors Q6 and Q16, of positive output stage 84 and negative output stage 94, respectively, to be cut off. Restated, as node II increases in voltage, transistors Q16 are turned off and when node I is decreased in voltage, transistors Q6 are turned off, resulting in a floating output from driver 30 in the inhibit mode. This leaves the low capacitance Schottky diodes of inhibit diodes 88 and 90 connected to the output of driver 30 resulting in a very low capacitance output line in the inhibit mode.

To prevent the drive voltage translators 54 and 56 and their associated units from fighting the inhibit mode transistors, Q3 and Q13 have been included in voltage translators 54 and 56, respectively. Transistors Q3 and Q13 are responsive to the applied inhibit signal and, when inhibit is true, each of these transistors are activated causing the output collector current of transistors Q5 and Q15 of positive and negative slewing stages 6 and 72, respectively, to both assume their 5 ma collector current state and thus allow nodes I and II to invert. Without transistors Q3 and Q13, one of transistors Q5 or Q15 would be in the high collector current state and the other would be in the low collector current state with the drive and inhibit signals opposing each other causing a great deal of heat dissipation in the circuit. Therefore transistors Q5 and Q15 are never on at the same time that transistors Q25 and Q35 are on and vise versa.

I claim:

1. A pulse converter circuit for converting a first digital signal compatible with a first logic family having first predetermined high and low logic levels and positive and negative slew rates, to a second digital signal compatible with a second logic family having second predetermined high and low logic levels and positive and negative slew rates, said circuit comprising:

first means for receiving said first digital signal, and signals representative of the predetermined high and low logic levels and the positive and negative slew rates compatible with the second logic family;

first voltage translator means for continuously detecting the logic state and state transitions of said first digital signal;

slew rate adjustment means for establishing logic state transition rates in response to the predetermined positive and negative slew rate representative signals at the transition times detected by said voltage translator means;

first clamp means for establishing the high and low logic levels of the second digital signal in response to the signals representative of the predetermined high and low logic levels, and the transition rates established by the slew rate adjustment means; and output means coupled to the first clamp means, for presenting a composite second digital signal.

2. A pulse converter circuit as in claim 1 wherein said first voltage translator means includes first differential amplifier means compatible with the first logic family.

3. A pulse converter circuit as in claim 2 wherein said slew rate adjustment means includes:

first voltage to current converter means coupled to receive the voltage signal representative of the predetermined positive slew rate for generating a current representative thereof;

second voltage to current converter means coupled to receive the voltage signal representative of the predetermined negative slew rate for generating a current representative thereof;

second differential amplifier means responsive to the output signal of the first differential amplifier means for generating an output current transition for causing the logic state transition from the low state to the high state of the circuit to have the predetermined positive slew rate;

third differential amplifier means responsive to the output signal of the first differential amplifier means for generating an output current transition for causing the logic state transition from the high state to the low state of the circuit to have the predetermined negative slew rate.

4. A pulse converter circuit as in claim 3 wherein:

the output of second differential amplifier forms node I and the output of third differential amplifier forms node II; and said first clamp means includes:

positive clamp means connected to node I and coupled to receive the signal representative of the predetermined high logic level for fixing the magnitude of the steady-state voltage on node I to the value of the signal representative of the predetermined high logic level; and negative clamp means connected to node II and coupled to receive the signal representative of the predetermined low logic level for fixing the magnitude of the steady-state voltage on node II to the value of the signal representative of the predetermined low logic level.

5. A pulse converter circuit as in claim 4 wherein said output means includes:

transistor means coupled between nodes I and II; and bias means coupled between nodes I and II for maintaining a constant voltage separation between said nodes to maintain said transistor means biased in the active region.

6. A pulse converter circuit as in claim 5 wherein:

said bias means maintains a preselected voltage difference between nodes I and II;

said second differential amplifier means having a high and a low output current when said first digital signal is in its high and low logic state, respectively; and said third differential amplifier means having a high and a low output current when said first digital signal is in its low and high logic state, respectively.

7. A pulse converter circuit as in claim 6 wherein the positive and negative slew rates of the second digital signal result from the difference between the output currents of said second and third differential amplifiers and the parasitic capacitance of the circuit.

8. A pulse converter circuit as in claim 1 wherein:
said first means also receives an output inhibit signal; and
said circuit further comprises:
  second voltage translator means for detecting the inhibit signal and for inhibiting the output of said second digital signal during that period.

9. A pulse converter circuit as in claim 8 wherein said second voltage translator means includes:
  fourth differential amplifier means for detecting the inhibit period of the inhibit signal; and
  second clamp means for inhibiting the output by causing the output means to provide a floating output terminal.

10. A pulse converter circuit as in claim 4 wherein:
said first means also receives an output inhibit signal; and
said circuit further comprises:
  second voltage translator means for detecting the inhibit period of the inhibit signal and for inhibiting the output of said second digital signal during that period by inverting the voltages on nodes I and II.

11. A pulse converter circuit as in claim 10 wherein said second voltage translator means includes:
  fourth differential amplifier means coupled between the first means and nodes I and II for detecting the inhibit period and inverting the voltages on nodes I and II; and
  second clamp means for inhibiting the output by causing the output means to provide a floating output terminal by clamping nodes I and II to the predetermined low and high logic levels of the second digital family, respectively.

12. A method of converting a first digital signal compatible with a first logic family to a second digital signal compatible with a second logic family having predetermined high and low logic levels and positive and negative slew rates, said method comprising the steps of:
  a. continuously monitoring the logic state and detecting the state transitions of said first digital signal;
  b. establishing logic state transition rates corresponding to the predetermined positive and negative slew rates at the detected state transition times of the first digital signal;
  c. translating the high and low logic state levels of the first digital signal to the predetermined high and low logic state levels of the second digital signal, respectively; and
  d. linking the predetermined high and low logic levels one to the other with the corresponding state transition rate to form the second digital signal.

13. A method as in claim 12 wherein the transition rates of the first digital signal are at least as fast as the transition rates of the second digital signal.

14. A method as in claim 12 further comprising the step of inhibiting the conversion in response to a predetermined inhibit signal.

* * * * *